US008143149B2

(12) United States Patent
Gilman

(10) Patent No.: US 8,143,149 B2
(45) Date of Patent: Mar. 27, 2012

(54) METHOD OF FORMING A FLEXIBLE NANOSTRUCTURED MATERIAL FOR PHOTOVOLTAIC PANELS

(76) Inventor: Boris Gilman, Mountain View, CA (US)

( * ) Notice: Subject to any disclaimer, the term of this patent is extended or adjusted under 35 U.S.C. 154(b) by 399 days.

(21) Appl. No.: 12/589,697

(22) Filed: Oct. 27, 2009

(65) Prior Publication Data

US 2010/0291725 A1      Nov. 18, 2010

Related U.S. Application Data

(60) Provisional application No. 61/216,400, filed on May 18, 2009.

(51) Int. Cl.
*H01L 21/20* (2006.01)
*H01L 21/208* (2006.01)
*H01G 9/20* (2006.01)
*B05D 5/12* (2006.01)
*B05D 7/22* (2006.01)

(52) U.S. Cl. .......... 438/497; 438/57; 427/475; 427/476; 427/74; 427/183; 427/196; 427/231; 257/E21.119; 257/E31.032; 977/724; 977/773; 977/890; 977/892; 977/932; 136/256

(58) Field of Classification Search .......... 438/57, 438/497; 977/724, 773, 890, 892, 932; 136/243, 136/256; 257/E21.114, E21.119, E31.032; 427/475, 476, 71, 72, 74, 76, 183, 189, 196, 427/231

See application file for complete search history.

(56) References Cited

U.S. PATENT DOCUMENTS

| | | | |
|---|---|---|---|
| 4,822,692 A * | 4/1989 | Koehler | 428/547 |
| 5,770,126 A | 6/1998 | Singh et al. | |
| 6,368,406 B1 | 4/2002 | Deevi et al. | |
| 6,696,107 B2 | 2/2004 | Eastham | |
| 7,074,353 B2 * | 7/2006 | Jachuck et al. | 264/7 |
| 7,585,751 B2 | 9/2009 | Kirihara et al. | |
| 2005/0112278 A1 * | 5/2005 | Obata et al. | 427/231 |
| 2005/0133087 A1 | 6/2005 | Alivisatos et al. | |
| 2005/0257738 A1 * | 11/2005 | Tateishi et al. | 118/300 |
| 2006/0093749 A1 | 5/2006 | Kim et al. | |
| 2008/0108122 A1 | 5/2008 | Paul et al. | |
| 2008/0142075 A1 | 6/2008 | Reddy et al. | |
| 2008/0274282 A1 | 11/2008 | Bent et al. | |
| 2009/0020924 A1 * | 1/2009 | Lin | 264/605 |

(Continued)

OTHER PUBLICATIONS

"Efficient solution-processed infrared photovoltaic cells", *Applied Physics letters*, 90, 183113.
"Advanced inorganic materials for photovoltaics", *MRS Bulletin*, 32, 211-214.

(Continued)

*Primary Examiner* — Mary Wilczewski

(57) ABSTRACT

An efficient and low-cost method is intended for forming a flexible nanostructured material suitable for use as an active element of a photovoltaic panel. The method consists of evaporating a colloidal solution, which contains nanoparticles of various sizes and/or masses, from a flat surface of a rotating body on which the solution forms a thin and easily vaporizable layer, and simultaneously releasing the nanoparticles from the solution for their free flight through a gaseous medium toward the flexible substrate. As a result, the particles of different sizes and/or types of material are deposited onto the flexible substrate in a predetermined sequence that corresponds to the magnitude of resistance experienced by the nanoparticles during their free flight. In this method, the final, flexible nanostructured material is formed as a multilayer nanostructured film in which the nanoparticles of larger size and greater density are deposited onto the flexible substrate first and thus are located under the nanoparticles of smaller size and smaller density.

22 Claims, 6 Drawing Sheets

U.S. PATENT DOCUMENTS

| | | | |
|---|---|---|---|
| 2010/0288196 A1* | 11/2010 | Gilman | 118/723 R |
| 2010/0291725 A1* | 11/2010 | Gilman | 438/57 |
| 2011/0036845 A1* | 2/2011 | Nielsen | 220/495.01 |
| 2011/0059261 A1* | 3/2011 | Sumida et al. | 427/459 |

OTHER PUBLICATIONS

"The photoconversion mechanism of excitonic solar cells", *MRS Bulletin*, 30, 20-22.

"Solar cells based on quantum dots: multiple exciton generation and intermediate bands", *MRS Bulletin*, 32, 236-240.

"Air-stable all-inorganic nanocrystal solar cells processed from solution", Science, 310, 462-465.

"Nanostructured Organic-inorganic Hybrid Solar Cells", MRS Bulletin, 34, 95-100.

"Aerosol Technology" by W.C.Hinds, John Wiley & Sons, 1999, 48-50.

* cited by examiner

L=2cm

L=10cm

METHOD OF FORMING A FLEXIBLE NANOSTRUCTURED MATERIAL FOR PHOTOVOLTAIC PANELS

CROSS-REFERENCE TO RELATED APPLICATIONS

This application claims priority from U.S. Provisional Patent Application No. 61/216,400 filed on May 18, 2009 titled "Method and apparatus for depositing nanoparticle layers in predefined order of their size and/or type of material (nanostructured films)" and is incorporated herein in its entirety.

FIELD OF THE INVENTION

The present invention generally relates to flexible nanostructured materials, in particular to highly efficient and low-cost flexible materials for photovoltaic (PV) and optoelectronic (OE) applications. More specifically, the invention relates to a method of manufacturing a composite material consisting of a flexible substrate and a multilayer nanostructured PV-active film supported by the substrate. The method applies to the forming of high-efficient and low-cost PV solar panels of large surface area.

BACKGROUND OF THE INVENTION

Nanoparticles of various semiconductors can be synthesized by means of a well known colloidal organic process (see "Efficient solution-processed infrared photovoltaic cells," *Applied Physics Letters*, 90, 183113) by deposition from a gas phase or by sputtering. The typical size of a nanoparticle (required for band gap tuning and quantum confinement) ranges from 2 to 8 nm. Nanoparticles may have different shapes, such as quantum dots, wires, rods, crystals, etc. Nanoparticles suitable for photovoltaic (PV) application are exemplified by Si, Ge, CdTe, CdSe, CdS, InP, TiOx, InAs, PbS, PbSe, HgTe, $CuInSe_2$, $CuInGaSe_2$, etc. (see "Advanced inorganic materials for photovoltaics," *MRS Bulletin*, Vol. 32, pp. 211 to 214).

Typically, in manufacture of a PV device, a nanoparticle-containing solution is deposited onto a precoated transparent substrate (e.g., glass) and consequently is converted into a very thin film (30 to 200 nm) of a selected type by the spin-casting procedure. Nanoparticles also can be embedded in some photoactive organic films (e.g., polymers) to form a "hybrid" hetero-junction PV device or a bilayer structure to form a bulk hetero junction (see "Semiconductor-nanocrystal/conjugated polymer thin films," U.S. Patent Application Publication, US2005/0133087, inventor Alivisatos, A. Paul, et al, which discloses manufacture of thin films comprising inorganic semiconductor nanocrystals dispersed in semiconducting polymers in high loading amounts).

In addition to the potential simplicity and low processing cost of nanoparticle-based films, such films possess some unique material properties highly desirable for PV applications. Such properties relate to better ability of nanoparticles to use incoming radiation energy, particularly in the IR portion of the spectrum, as compared with bulk and TF counterparts. The aforementioned properties contribute to the mentioned capability of nanoparticle-based materials (for further explanation see "The photoconversion mechanism of excitonic solar cells," *MRS Bulletin*, Vol. 30, pp. 20 to 22 and "Solar cells based on quantum dots: multiple exciton generation and intermediate bands," *MRS Bulletin*, Vol. 32, pp. 236 to 240).

It should be noted that nanoparticle "patterning" mentioned in some references, such as U.S. Pat. No. 6,696,107 issued in 1994 to Derek A. Eastman and U.S. Patent Application Publication US2006/093749, typically relates to device layout formation along the active surface of a device (i.e., horizontal patterning) rather than cross-section patterning across active nanoparticle layers (i.e., vertical patterning). Other types of nanoparticle-based films can be formed in the complimentary layer that has a junction interface with the first layer, e.g., as in the reference "Air-stable all-inorganic nanocrystal solar cells processed from solution," *Science*, Vol. 310, pp. 462 to 465. Although the size of a nanoparticle in some of the aforementioned film can be well controlled (see Patent Application Publication WO2008/136882 and U.S. Patent Application Publication 2007/111697), all aforementioned methods of depositing nanoparticle-based layers are incapable of providing nanoparticle-structured films that consist of nanoparticle layers positioned in a predefined order of size or type of material. The aforementioned methods do not provide for proper control of nanoparticle layer structure across film with regard to type of material or size.

In other words, known methods of forming nanocomposite films by depositing and processing nanoparticle-based layers are fundamentally limited in producing predefined nanoparticle spatial arrangements of size or type of material. Consequently, PV devices made of such nanocomposite films typically exhibit low carrier transport and collection efficiency (i.e., internal quantum efficiency), incomplete spectral coverage, limited Voc, etc. Some advanced nanocomposite structures for PV applications are described in "Nanostructured Organic-inorganic Hybrid Solar Cells," *MRS Bulletin*, Vol. 34, pp. 95 to 100. It should be noted, however, that none of the proposed structures present a nanostructured film that comprises a sequence of nanoparticle layers arranged in the order of their size or type of material.

U.S. Patent Application Publication 20080142075A1 published in 2008 (inventor D. Reddy, et al) describes nanoparticle-based films and related PV devices that may have nanoparticle layers formed on a substrate in order of nanoparticle size (nanostructured film). Certain PV devices, such as solar cells, are described as using nanoparticle-based film of the aforementioned type as one of the PV-active layers. According to the aforementioned invention, such a PV-device will have an electropotential gradient (i.e., an electric field) that results from a nanoparticle size gradient and a related shift in energy band, thus significantly improving the drift component of photo-generated carriers. That, in turn, will result in enhanced carrier transport and collection efficiency (i.e., internal quantum efficiency) of the device. Also, based on the photo-conversion mechanism in nanoparticle-based materials as described in "The photoconversion mechanism of excitonic solar cells," *MRS Bulletin*, Vol. 30, pp. 20 to 22, PV devices made of such materials are expected to provide higher Voc.

U.S. Patent Application Publication 20080108122 published in 2008 (inventor B. K. Paul, et al) discloses embodiments of microchemical nanofactories that could be used to fabricate a variety of tailored gradient structures from nano-, micro-, and macroscale particles in which the particles are arranged in sequential layers and vary in size or density, or both.

However, known methods for forming sequential layers of PV nanostructures with gradual change in nanoparticle size or type of material in the direction away from the substrate requires highly complex and lengthy deposition and control processes, which is not a cost-effective solution. Furthermore, it is possible that application of any layer may partially or entirely damage the preceding nanoparticle layer and that the suggested method will not be justifiable for coating surfaces of large areas.

Also known in the art are methods for forming intermetallic nanoparticles by evaporating a liquid component of a nanoparticle-containing solution, which is achieved, e.g., by irradiating such a solution with a high-energy beam.

U.S. Pat. No. 6,368,406 issued in 2002 to S. Deevi, et al, discloses a method of forming intermetallic nanoparticles by subjecting a starting material to laser energy so as to form a vapor and condensing the vapor so as to form intermetallic nanoparticles. The starting material can be a mixture of pure elements or an alloy of two or more elements. The nanoparticles can be provided with a narrow size distribution, with an average particle size of 2 to 100 nm, preferably 2 to 9 nm. The nanoparticles can be formed in a vacuum chamber wherein a temperature gradient is provided. The atmosphere in the chamber can be an inert atmosphere, such as argon, or a reactive atmosphere, such as isobutene or oxygen. An electric field can be used to form filaments of the nanoparticles.

U.S. Pat. No. 5,770,126 issued in 1998 to J. Singh, et al, discloses a process and apparatus for producing nanoscale particles using the interaction between a laser beam and a liquid precursor solution. According to one embodiment, a solid substrate is used during laser-liquid interaction. The laser beam is directed at the solid substrate, which is immersed in the liquid precursor solution, and rotates.

However, the patents that describe methods and apparatuses for separation of nanoparticles from solutions do not teach any technique for arranging nanoparticles into specifically structured layers, in particular into layers composed of nanoparticles structured in terms of their sizes or masses.

SUMMARY OF THE INVENTION

The present invention provides a novel and efficient method of depositing multilayer nanostructured films on a substrate to ensure a predefined sequence of nanoparticle layers, each layer having nanoparticles of the same size or type of material, or both. According to one or several aspects of the invention, the proposed method of depositing multilayer nanostructured film also provides a predefined sequence of layers in accordance with the size of nanoparticles in the layer. Nanoparticles are assumed to have a round shape of a given radius (quantum dots). The type of material (e.g., InAs, CdSe, etc.). from which the nanoparticle is made defines the density of a nanoparticle. The method of this invention provides depositing nanostructured films on various types of substrates, preferably on flexible substrates of a large area and preferably precoated with conductive and barrier layers.

According to one aspect of the invention, the multilayer nanostructured film can be deposited in a form of an all-inorganic (i.e., consisting of nanoparticles only) structure on the surface of a substrate or, according to another aspect of the invention, in the form of nanoparticle layers embedded into a polymer-based film which was preliminarily applied onto the substrate surface. In both cases, the aforementioned bulk heterojunction structure is achieved in the deposited film, thus making it possible to ensure PV-energy conversion. According to the present invention, the method can be used to form a novel type of flexible nanostructured material suitable for highly efficient and low-cost PV applications, as well as for optoelectronic, microelectronic, and other applications.

According to the present invention, the method of depositing multilayer nanostructured films is based on the principles of nanoparticle motion (flight) through a gaseous medium. Hereinafter this process of flying particles is referred to as "FP process" and the term "flying particles" is abbreviated "FP." The concept and the physical model of the FP process are described below. The essence of the method, according to this invention, is to create conditions for nanoparticles of a different size and/or type of material to fly from a properly prepared nanoparticle-containing solution toward a preplaced flexible substrate and through the selected gaseous medium, thus experiencing ambient resistance forces. The nanoparticle-containing solution has a predefined mixture of nanoparticles of different sizes or densities, or both. According to the mechanical laws of motion (i.e., Newton's and Stokes' laws), resistance force experienced by a given nanoparticle moving through a gaseous medium depends on ambient resistance (dynamic viscosity) and on the velocity, size, and density of the nanoparticle.

According to one aspect of the invention, equal initial velocity is provided for all nanoparticles contained in the solution. In this case, for a given gas of a given pressure the resistance force experienced by an FP depends on its instantaneous velocity, size, and density (i.e., type of material). It should be noted that FP motion through the gaseous medium is considered to be identical to the motion of a regular solid mass through the same medium and consequently following the same mechanical laws. This assumption is correct for any FP that has a momentum value much greater than an average momentum value for the gas molecules at a given temperature and pressure. Such conditions are satisfied for a wide range of FP mass and velocities. Analysis of forces and accelerations acting on an FP (described in more detail in the following sections) shows that, according to Newton's and Stokes' Laws, FP acceleration is a direct function of FP size or density, or both, so that FPs of different sizes or types of material receive different accelerations during their flight to a substrate. This results in a different time-to-target ("arrival time") for FPs of different size or density, or both, and consequent formation of nanoparticle layers in the order of increasing or decreasing size or alternating types of material. By selecting a nanoparticle mixture of predefined sizes and types of materials in the initial nanoparticle-containing solution, the proposed method will create a sequence of nanoparticle layers with well controlled thickness of each layer following each other in order of size or type of material, or both, throughout the film, thus forming a desired multilayer nanostructured film.

According to one aspect of the present invention, the FP process described above is realized in an apparatus that comprises the following: (1) sealable cylindrical chamber filled with gas of a required pressure; (2) initial flexible substrate made of an insulating film and precoated with a proper conductive coating (e.g., in the form of a metal conductive film with a carrier-blocking layer on top of the film that covers the inner wall of the chamber; (3) colloidal nanoparticle-containing solution supplied to the recess of a rotating body, such as a rotating crucible located in the interior of the chamber; (4) means for driving the aforementioned crucible into rotation and means for moving the aforementioned crucible in the vertical direction of the chamber; (5) power laser capable of interaction with the contents of the crucible by irradiating a predetermined part of the crucible surface; (6) other auxiliary components of the chamber required for the process, such as the source of vacuum, the colloidal solution source, the source of electric supply, etc.

The nanoparticle-containing solution comprises a predefined mixture of nanoparticles of different sizes and/or type of material dissolved, e.g., in a solution. Conditions are created in the deposition process for nanoparticle-containing solutions to rotate together with the crucible, to move radially outward under the effect of centrifugal forces, and to partially evaporate during the deposition process under the effect of laser irradiation. While the solution evaporates, the nanoparticles remain intact and fly out of the solution in the tangential direction of the rotating crucible. As mentioned above, each FP experiences a resistance force that depends on the size and density (i.e., type of material) of the particle. Therefore, the time-to-target will be differentiated for different particles and will provide different positions of the particles on the substrate, thus forming a nanostructured film with layers arranged in sequence and corresponding to nanoparticle size and/or type of material.

If the nanoparticles are made, e.g., from Si, Ge, CdTe, CdSe, CdS, InP, TiOx, InAs, PbS, PbSe, HgTe, $CuInSe_2$, $CuInGaSe_2$, etc., and if the substrate coating is made from an electron-collecting thin metal film combined with hole-blocking layers such as $C_{60}$, then the obtained flexible nanostructured material is suitable for use as a high-efficient low-cost solar panel.

DETAILED DESCRIPTION OF THE INVENTION

Figure 1:
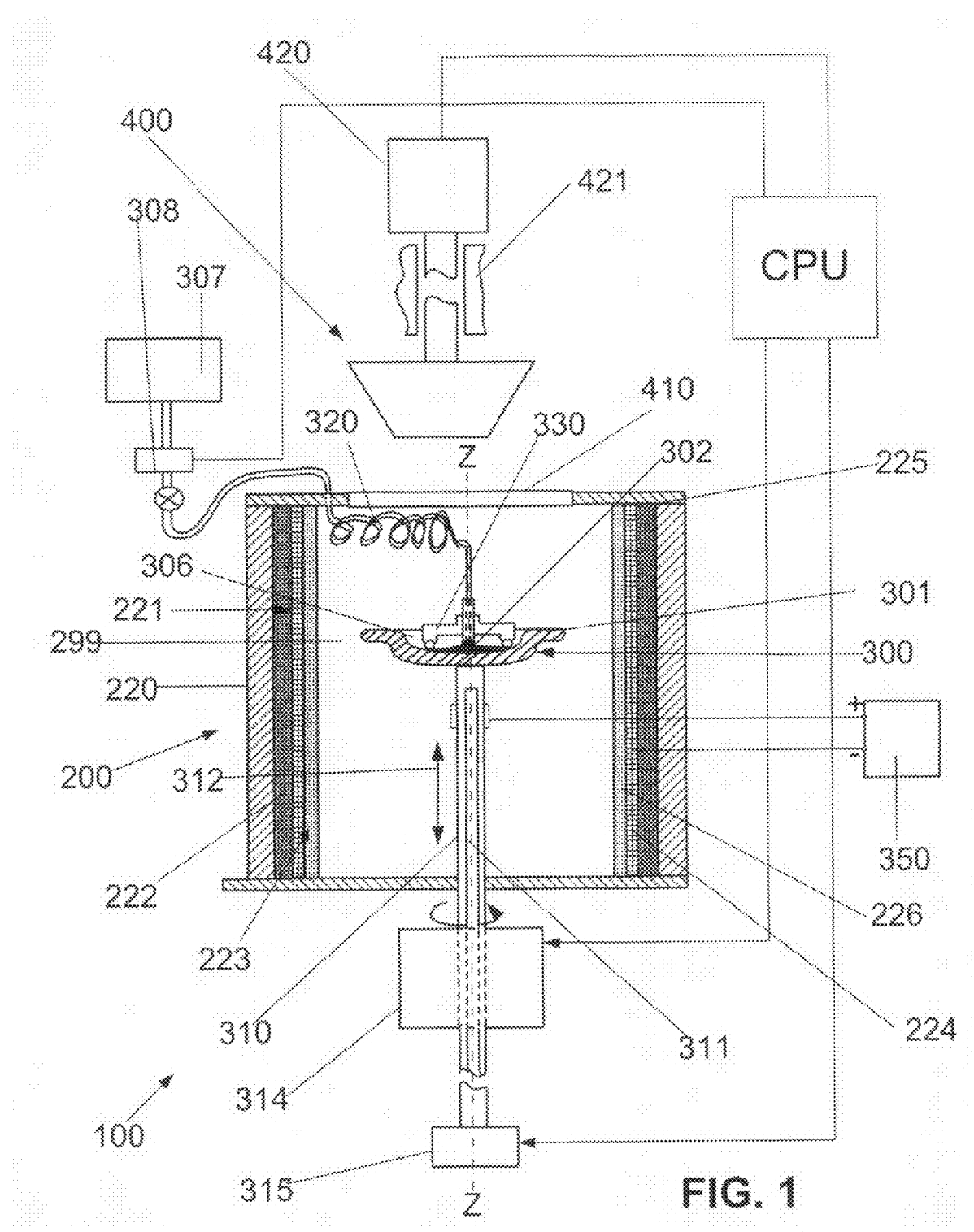
FIG. 1 is a schematic elevational sectional view of the apparatus for realization of the method, the components being shown in static.

In the context of the present invention, the term "flexible nanostructured material" means the combination of a flexible substrate that includes preliminarily applied conductive and other suitable layers and a multilayer nanostructured film formed on the surface of the top conductive layer.

In the context of the present invention, the term "multilayer nanostructured film" (hereinafter referred to merely as "nanostructured film") means a film that comprises a sequence of nanoparticle layers arranged in order of size and type of material.

For better understanding of the principle of the invention, it would be advantageous first to give some simplified theoretical explanation of the FP process.

In accordance with the present invention, the method for depositing a multilayer nanostructured film onto a flexible substrate is based on the motion of a nanoparticle through a gaseous medium (i.e., the FP process as defined above). The physical model of the FP process on which the method of the invention is based will now be described in more detail.

According to Newton's and Stokes' laws, the motion equation for a small spherical particle in a continuous viscous medium is written as follows:

$$m \cdot dV/dt = -6\pi \cdot \mu \cdot r \cdot V/Cp \qquad (1)$$

where m is nanoparticle mass, $\mu$ is gas dynamic viscosity, r is nanoparticle radius, V is instantaneous velocity of FP, Cp is the slip factor, the numerical value of which may be different from "1" for a very small nanoparticle (see *Aerosol Technology: Properties, Behavior, and Measurement of Airborne Particles* by W. C. Hinds, John Wiley & Sons, 1999, pp. 48 to 50). Noting that $m = \rho \cdot 4/3 \cdot \pi \cdot r^3$, where p is the density of the material from which the nanoparticle is made (defined by the type of material), the following equation results from equation 1:

$$dV/dt = -K/(\rho \cdot r^2) \qquad (2)$$

where K is the composite factor that reflects specific features of FP motion through the viscous ambient, such as gas pressure, dynamic viscosity, etc.

Equation 2 above shows that for each specific value of the factor K, the values of V and dV/dt (which is FP acceleration) strongly depend on both nanoparticle size (radius, r) and density, $\rho$. In turn, the time it takes for a given FP to reach the target positioned at a given distance from the starting point (hereafter referred to as "time-to-target") depends on nanoparticle radius and density, thus providing consecutive deposition of nanoparticle layers in order of size and type of material.

Equation 2 above can be easily solved, and the resulting plots are shown and described below (see FIGS. 6A to 6D). It should be noted that according to one embodiment of the present invention, the electric field can be applied to the space through which FPs fly. In this case, motion equations 1 and 2 can be slightly modified to include potential impact from the electric field without significantly changing the dependence of FP motion parameters on size and density of the FP.

Figure 2:
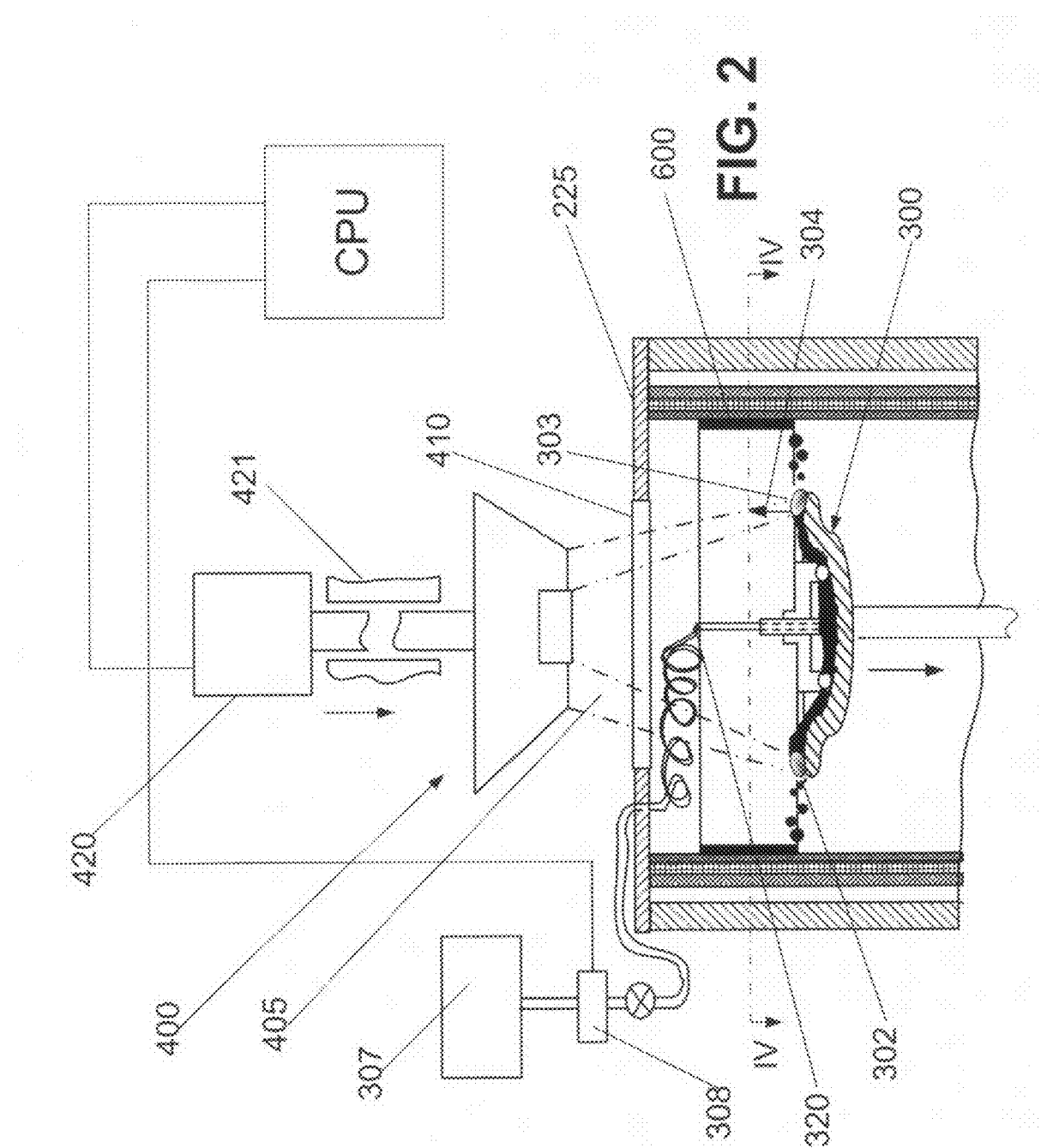
FIG. 2 is a partial view of the apparatus in FIG. 1, showing the apparatus in action.
Figure 3:
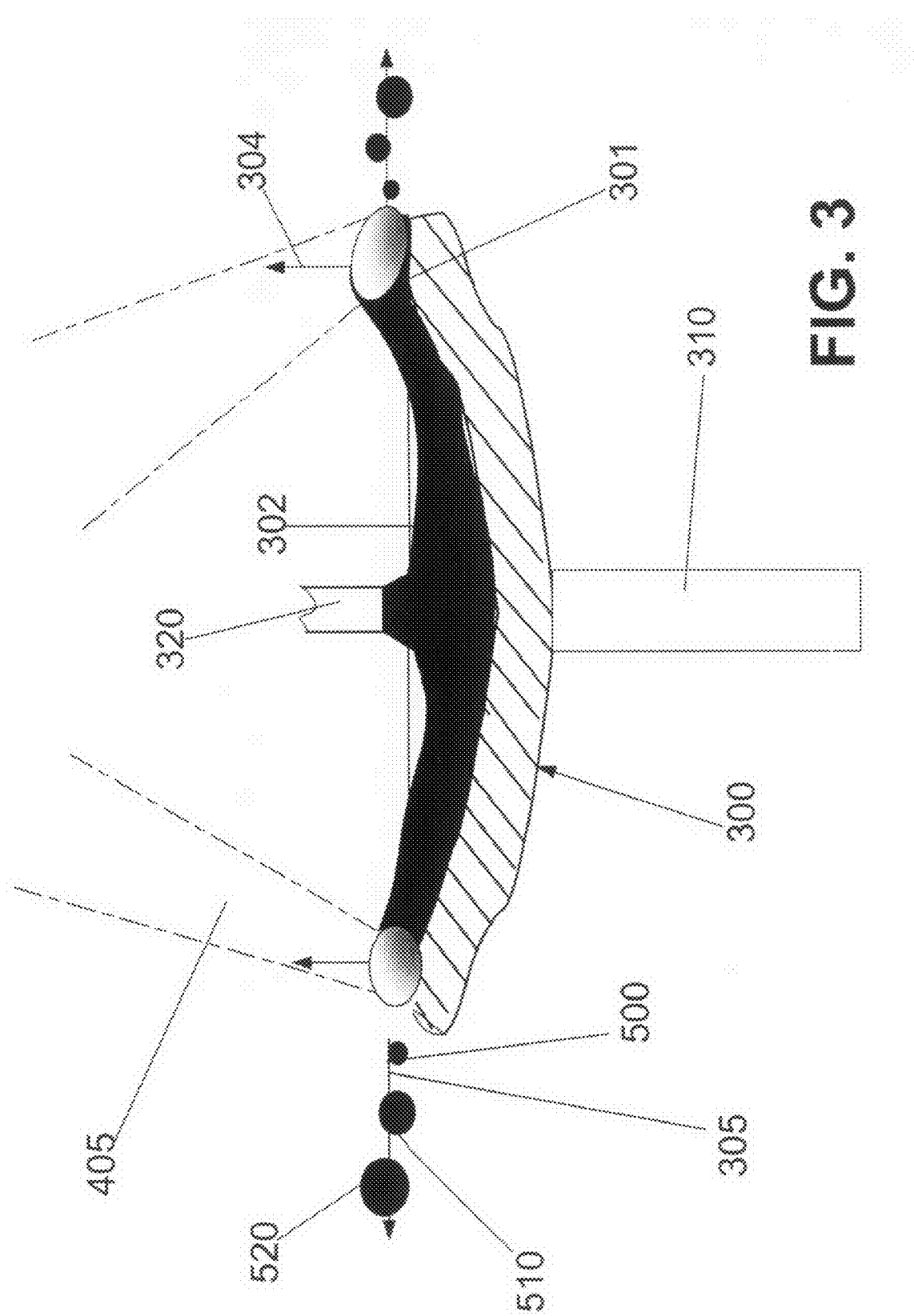
FIG. 3 is a view that details the essential parts of the apparatus of FIGS. 1 and 2 on a larger scale.
Figure 4:
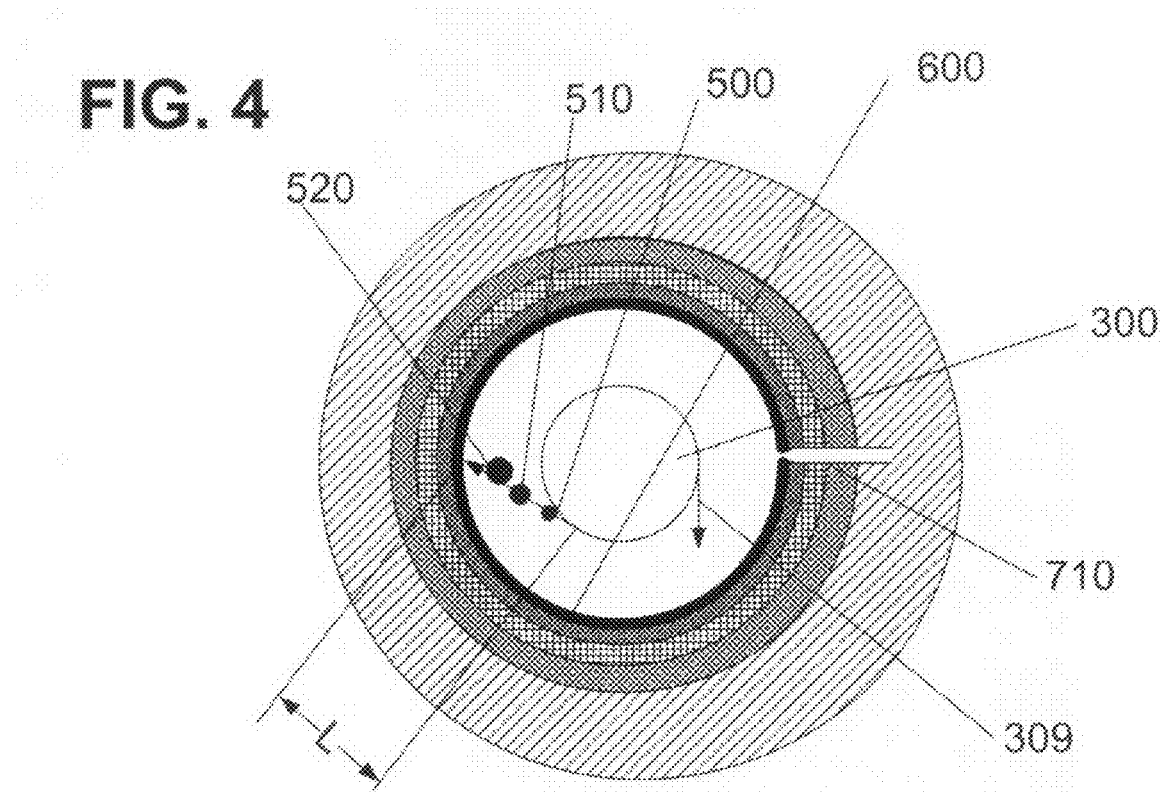
FIG. 4 is a sectional view along line IV-IV of FIG. 2, some details being omitted for simplicity of explanation.

According to one aspect of the present invention, the FP process described above is realized in the apparatus shown in FIGS. 1 to 4 in both static and dynamic (process) modes, where FIG. 1 is a schematic elevational sectional view of the apparatus for realization of the method of the invention, the components being shown in static; FIG. 2, similar to FIG. 1, shows the apparatus in action; FIG. 3 shows the details of the essential parts of the apparatus in FIGS. 1 and 2 on a larger scale; and FIG. 4 is a top view of the apparatus shown in FIG. 2, with some details omitted for simplicity of explanation.

It is understood that the view in FIG. 1 is a general schematic of the apparatus 100 for realization of the method of the invention. The apparatus 100 shown in this drawing comprises a sealable cylindrical chamber 200 that has an inner wall 220 and is filled with a gaseous medium (e.g., nitrogen) maintained at a required pressure that, depending on specific operational conditions, may vary in the range of 0.1 mTorr to 100 mTorr. Reference numeral 225 designates the cover of the chamber 200 with an optical window 410 for an energy source, as mentioned below.

Placed onto the inner wall 220 of the chamber 200 is a flexible substrate 221 that consists, e.g., of an insulating layer, e.g., a vinyl layer 222, which is precoated with a proper multilayer conductive coating 223 that comprises, e.g., a conductive film, such as a metal film 224 made, e.g., of Al, Cr, Ti, or the alloys thereof, and a carrier-blocking layer, e.g., a hole-blocking layer 226 on the top of a metal film 224. After placement onto the inner wall 220 of the chamber 200, the flexible substrate is turned into a cylindrical body.

It should be noted that in accordance with another aspect of the invention, the layers used for precoating the vinyl layer 222 may comprise a conductive polymer film (not shown) in a soft, semiliquid state.

The chamber 200 contains in its interior a rotating body, hereinafter referred to as "crucible 300" which is rotationally supported by a shaft 310 driven, e.g., by an electric motor 314. In addition to the rotary motion, the crucible can perform linear motion in the vertical direction, shown by arrow 312. For this purpose, the apparatus 100 is provided with a linear stepper motor 315, and a guide key 311 is provided on the shaft 310 for guiding the crucible along the shaft.

As shown in FIG. 1, the cylindrical body of the flexible substrate 221 has a longitudinal axis Z-Z and surrounds the crucible 300 so that a space 299 is provided between the crucible and the flexible substrate.

On its upper side, the crucible has a recess 306 intended for receiving a liquid medium, i.e., the nanoparticle-containing solution 302 that is supplied to the recess 306 from a supply container 307 located outside the chamber 200 and by means of a mass-flow controller 308 to the recess 306 of the crucible 300. The nanoparticle-containing solution may contain nanoparticles, the materials of which are selected from the group of materials belonging to groups IV, II-VI, and III-V of elements, metals, and metal oxides, said nanoparticles having sizes ranging from 2 nm to 10 nm. Examples of these materials are the following: Si, Ge, CdTe, CdSe, CdS, InP, TiOx, InAs, PbS, PbSe, HgTe, $CuInSe_2$, $CuInGaSe_2$, etc.

The path of the nanoparticle-containing solution contains a tube that passes through the wall 220 of the container and terminates in the flexible tube 320. The outlet end of the flexible tube 320 is maintained at a constant and predetermined distance from the surface of the recess 306 by means of a tube holder 330 that rests on the upper surface of the recess and is supported by frictionless members, such as balls. Thus, change in the vertical position of the crucible with respect to the wall 220 that holds the opposite end of the flexible tube is compensated by compensation loops of the flexible tube 320. Point contact of the holder with the crucible surface does not present an obstacle for movement of the nanoparticle-containing solution in the radial outward direction. Preferably, the upper side of the crucible recess 306 is smooth, e.g., polished for imparting to it antifriction properties, and has a surface 301 flattened toward the edges of the rotating body.

An essential component of the apparatus of FIG. 1 is the energy source, e.g., a power laser 400, capable of interacting with the nanoparticle-containing solution 302 located in the crucible 300 by irradiating a predetermined part of the crucible surface, i.e., a substantially flat peripheral surface 301 on which the solution forms a thin, easily vaporizable layer. For this purpose, the power laser 400 should have radiation energy sufficient for evaporating the liquid medium and should be capable of generating an annular-shaped beam (not shown in FIG. 1) for creating an annular light spot on the aforementioned peripheral surface. Such power lasers are known in the art, and the power laser 400 can be operated, e.g., on the principle of the power laser source described in U.S. Pat. No. 7,585,751 issued in 2009 to Naotoshi Kirihara and others.

Since during operation the crucible is moving in the vertical direction, i.e., in the direction of longitudinal axis Z-Z of the cylindrical body of the substrate 221, the apparatus 100 is provided with means for moving the laser 400 in synchronism with the crucible. In the illustrated example, these means comprise a stepper motor 420 connected to the laser 400 and guides 421 for guiding the laser 400 in the vertical direction.

The stepper motors 315 and 420, the rotor motor 314, and the mass-flow controller 308 are connected to a control unit, such as a central processing unit (CPU), which controls operation of the mechanisms and synchronizes their motions.

Not shown are auxiliary components of the apparatus required for the process, such as a gas-pressure control, colloidal solution preparation equipment, etc.

FIG. 2, a partial view of the apparatus in FIG. 1, shows the apparatus in action. According to one or several aspects of the invention, under command from the central processing unit (CPU), the process begins with raising the crucible 300 in the direction of the arrow 312 to the vertical position in which the upper surface 301 of the crucible is aligned with the position on the flexible substrate 221 from which deposition begins (this position is not shown in the drawings). By command from the CPU, the stepper motor 420 is activated and moves the laser 400 in the guides 421 to the position in which the beam generated by the laser is focused onto the aforementioned flat peripheral surface 301 of the crucible 300. The supply of nanoparticle-containing solution 302 begins and proceeds to the recess 306 of the crucible 300 from the container 307 by means of the mass-flow controller 308 and through the flexible tube 320. By the command sent from the CPU to the motor 314, the crucible 300 is brought into rotation by means of the shaft 310 with such frequency of rotation that causes movement of the nanoparticle-containing solution 302 under the effect of centrifugal force in the radial outward direction along the curved surface of the recess 306 to the flat peripheral surface 301 of the crucible 300. As a result, as shown in FIG. 2, a layer 303 of the nanoparticle-containing solution is formed on the surface 301. At this moment, the power laser 400 is activated, and an annular laser beam 405 is directed through the optical window 410 of the cover 225 (FIGS. 1 and 2) onto the aforementioned flat peripheral surface 301 on which the beam is focused.

Under the effect of the laser beam 405, a liquid component of the solution 302 evaporates instantaneously (i.e., in a very short time as compared to FP time-to-target), which is conventionally shown by arrows 304 in FIGS. 2 and 3, which are fragmental views of the crucible shown in operation on a larger scale (for simplicity, the tube holder 330 is not shown in the drawings). As a result, only the nanoparticles, which are solid and are designated by reference numerals 500, 510, 520, etc., remain and fly out from the edge of the circular crucible in the tangential direction. This is shown in FIG. 3 by arrow 305. FIG. 4 shows the tangentiality of nanoparticle flow (arrow 309) and flying distance L of an FP particle from the edge of the crucible 300 to the surface of the flexible substrate 221. From the moment the nanoparticles leave the crucible, they are turned into flying particles, i.e., FP, as defined earlier. It can be assumed that since the molecules of the solution layer 303 evaporate in the upward direction, as schematically shown by arrows 304, they will not create a noticeable resistance to the horizontal tangential movement of the nanoparticles 500, 510, etc., that fly out from the rotating crucible 300, as shown in FIG. 3. Reference numeral 600 designates the nanostructured film deposited onto layer 226 of the flexible substrate 221 (FIG. 1).

In FIG. 4, reference numeral 710 designates a slit that is formed between the edges of the rectangular flexible substrate 221 when the latter is formed into a cylinder and is inserted into the space formed by the inner walls 220 of the chamber 200.

Figure 5:
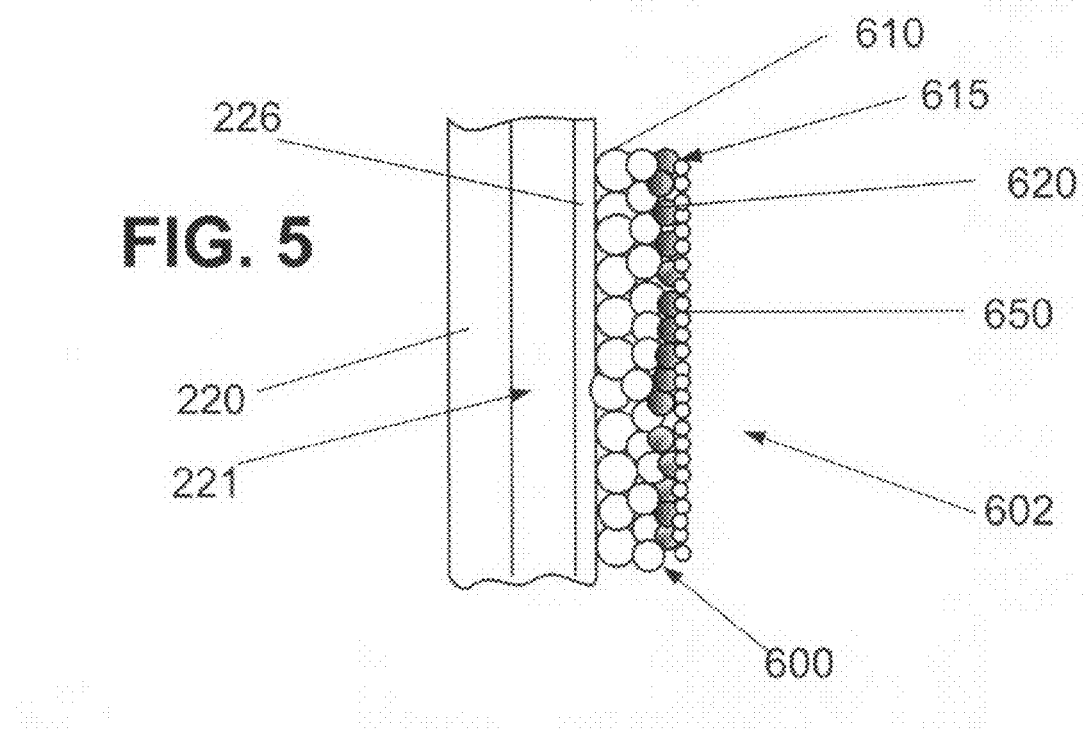
FIG. 5 is a sectional view that shows the structure of the flexible nanostructured material of the invention during its formation.

As described above at the beginning of the Detailed Description, instantaneous velocity V of each FP and FP acceleration dV/dt strongly depend on both nanoparticle size (radius, r) and type of material (density, ρ). In turn, the time it takes for a given FP to reach the target positioned at a given distance from the starting point (which hereinafter will be referred to as "time-to-target") depends on nanoparticle radius and density, thus providing consecutive deposition of nanoparticle layers in the order of their size and type of material. In other words, nanoparticles that form the nanostructured film are sorted by their dimensions and densities in the thickness direction of the film. Such a structure is shown in FIG. 5, which is a cross section of the nanostructured film 600 in the film-thickness direction. Here, reference numeral 221 designates the flexible substrate. A first layer 610, which is nearest the substrate 221, is formed from the largest or heaviest nanoparticles in the solution 302. A next layer 620, which deposited on the layer 610, is formed from particles that are smaller in size or lighter in mass, and so on. An uppermost layer 650 of the obtained nanostructured film 600 is formed from the smallest nanoparticles of the nanoparticle-containing solution. As a result, an item 602 of the flexible nanostructured material is obtained and comprises the flexible substrate 221 with the nanostructured film 600. Some of the aforementioned layers, e.g., a layer 615, may consist of nanoparticles made from material different from that of other layers. In this case nanoparticle size does not follow the rule of gradual increase in nanoparticle size outward in direction from the substrate. In FIG. 4 this is shown by different colors of the particles that form the layer 615.

It is understood that in reality there will be no strict boundaries between the layers of nanoparticles of different sizes and that the layers will be slightly intermixed, but the general trend will correspond to that described above and will provide a desirable gradient of nanoparticle size required for improving PV-conversion efficiency, which makes the nanostructured film of the invention suitable for efficient use in the manufacture of solar panels and in various optoelectronic devices. It is also understood that the spherical nanoparticles will not be ideally packed in the multiplayer structure 600 formed on the surface of the flexible substrate 221, but from the practical point of view the structure of the nanoparticle layers shown in FIG. 5 will be sufficient for providing essential improvement in PV-conversion efficiency.

It is also understood that nanoparticles that simultaneously leave the edge of the rotating crucible 300 will form a band of a certain width. Therefore, the speed "v" of the vertical movement of the crucible in the direction of arrow 312 (FIG. 2) should be coordinated with the width of the aforementioned band and with the time-to-target defined above.

Additionally, as shown in FIG. 1, in order to enhance attraction of nanoparticles to the substrate surface and to prevent FP recoil from this surface, an electric voltage source 350 may be electrically connected between the conductive (metal) layer 224 and the crucible 300. The purpose of the source 350 is to produce an electric field in the space intersected by FPs on their way to the substrate so that on FP arrival at the surface of the flexible substrate 221, an attractive electrical force is applied to the particles.

Figure 6A:
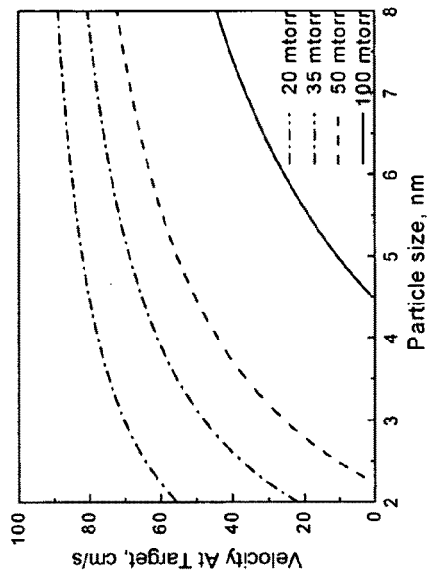
FIG. 6A is a graph that shows effects of nanoparticle size on time-to-target for various gas pressures in the chamber, the distance to target being equal to 2 cm.
Figure 6B:
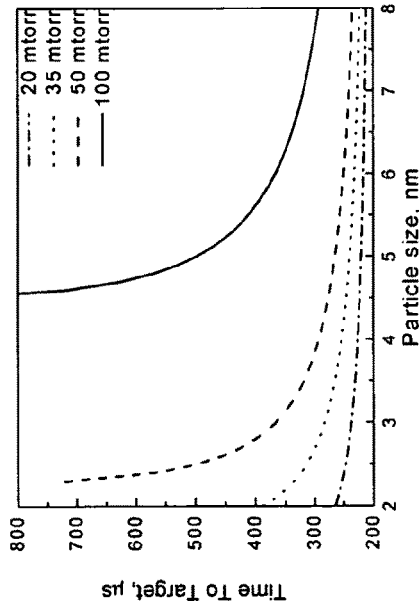
FIG. 6B is graph that shows effects of nanoparticle size on velocity at the target for various gas pressures in the chamber, the distance to target being equal to 2 cm.
Figure 6C:
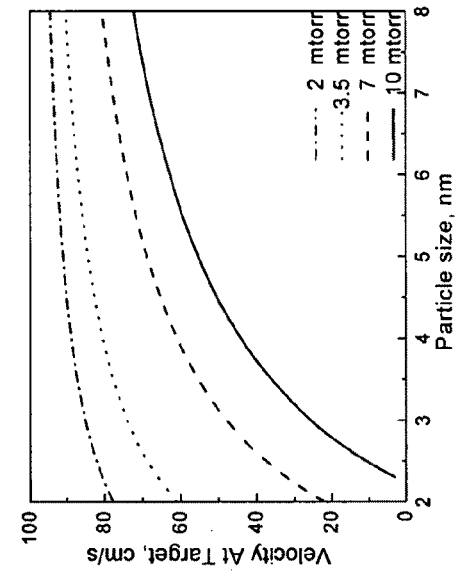
FIG. 6C is a graph that shows effects of nanoparticle size on time-to-target for various gas pressures in the chamber, the distance to target being equal to 10 cm.
Figure 6D:
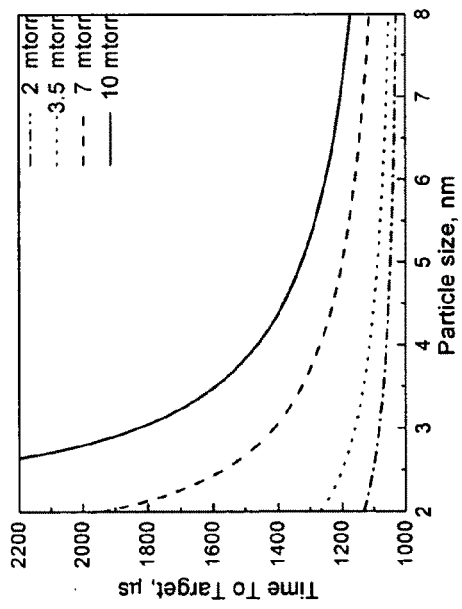
FIG. 6D is graph that shows effects of nanoparticle size on velocity at the target for various gas pressures in the chamber, the distance to target being equal to 10 cm.

FIGS. 6A through 6D show that time-to-target and FP velocity at the target depend on the size of the nanoparticles. In particular, FIG. 6A is a graph that shows effects of nanoparticle size on time-to-target for various gas pressures in the chamber, the distance to target being equal to 2 cm. FIG. 6B shows the effects of nanoparticle size on the velocity at target (arrival velocity) for various gas pressures in the chamber, the distance to target being equal to 2 cm. FIG. 6C is a graph that shows the effects of nanoparticle size on time-to-target for various gas pressures in the chamber, the distance to target being equal to 10 cm. FIG. 6D is a graph that shows the effects of nanoparticle size on the velocity at target for various gas pressures in the chamber, the distance to target being equal to 10 cm. All four drawings are shown for the specific materials of nanoparticles such as InAs or HgTe. Depending on the working gas pressure in the chamber, the respective curves are shown by solid lines, broken lines, dotted lines, or dash-and-dot lines.

Figure 7:
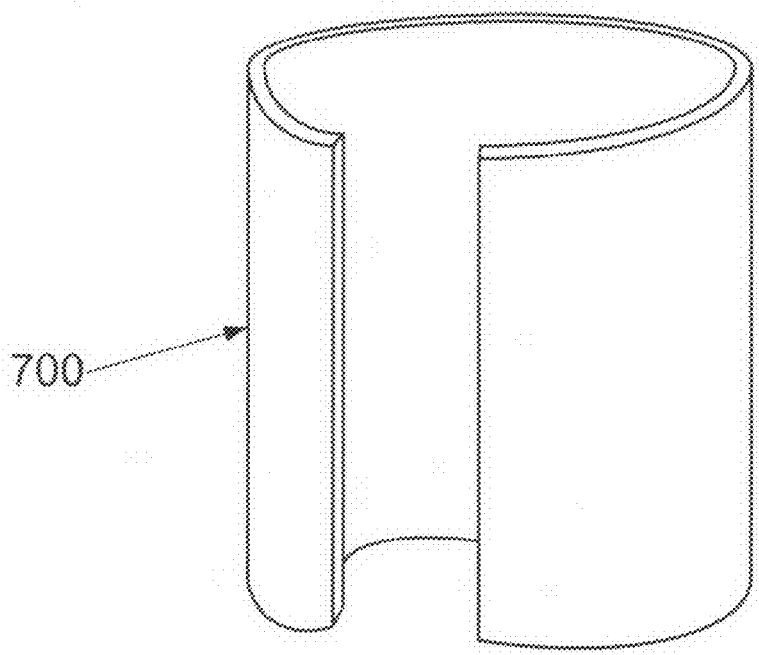
FIG. 7 is a view that shows a fragment of the flexible nanostructured item of the invention removed from the apparatus after nanoparticles are deposited onto the substrate.

On completion of the FP process, the chamber 200 is depressurized, the cover 225 is opened, and an item 700 of the flexible nanostructured material 602 is removed from the apparatus. FIG. 7 shows item 700 removed from the apparatus after nanoparticles are deposited onto the substrate. It is understood that the item 700 is unfolded into a flat plate-like piece (not shown) before solar panel assembly.

Figure 8:
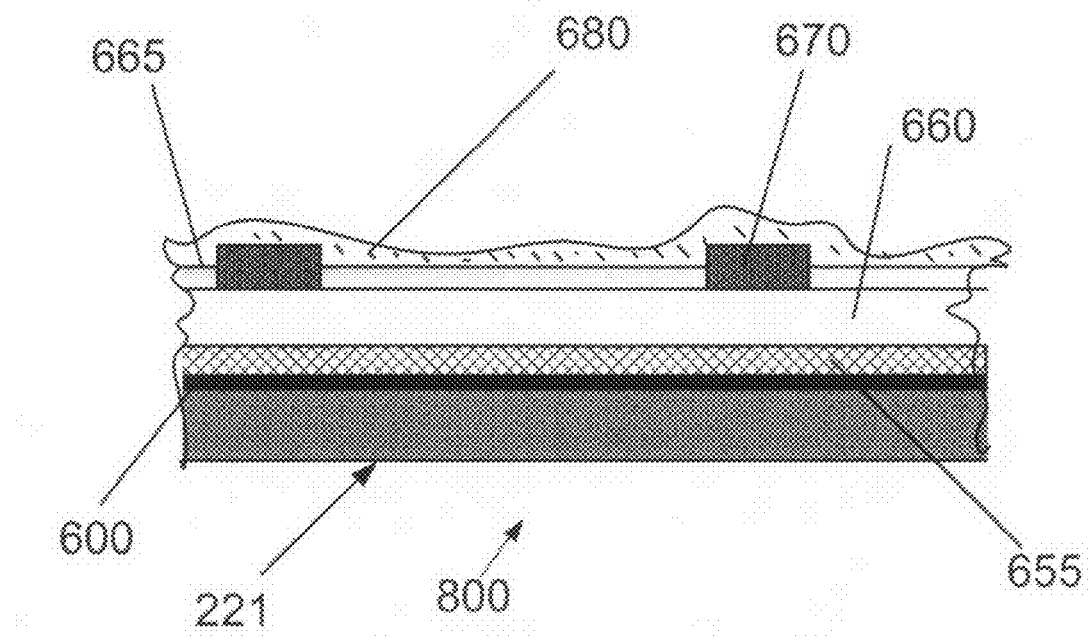
FIG. 8 is a cross-sectional view of a solar panel based on use of the flexible nanostructured item of the invention.

FIG. 8 is a cross-sectional view of a solar panel 800 based on use of the flexible nanostructured item 700 of the invention. The solar panel 800 is manufactured as follows. In the example shown in FIG. 8, a hole-conductive/electron-blocking layer 655 (e.g., TPD layer) is deposited on top of the nanostructured film 600, e.g., by spin casting. Optionally, an n-type layer (not shown) made, e.g., from amorphous silicon or conductive polymer, is applied onto the layer 655. The next layer 660, which is an indispensable transparent conductive oxide (TCO) made, e.g., of indium tin oxide (ITO), is placed onto the aforementioned n-type layer or directly onto the layer 660. Subsequent layers, which are inherent to any solar panel, may comprise metal electrodes (only one of which, i.e., the metal electrode 670, is designated in the drawing), an antireflective coating 665, and a protective layer 680.

The method according to the present invention can be illustrated by the following application example.

Apparatus Design Parameters:
1. Inner radius cylindrical chamber (of wall 220 of FIG. 1): 14 cm;
2. Radius of crucible 300: 10 cm;
3. Vertical length of chamber: 1.0 m;
4. Distance to target: 10 cm;
5.
6. Flexible substrate dimensions: 0.9×0.9 m$^2$ Process Parameters:
1. Rotational frequency of crucible during FP deposition: 9600 rpm (providing initial FP velocity is 100 m/s);
2. Pressure of gas (nitrogen) in chamber: 3 to 7 mTorr;
3. Pulse energy of laser 400: 0.01 to 0.1 J/cm$^2$;
4. Laser pulse duration: 10 to 100 ns;
5. Pulse frequency during process: e.g., 500 Hz;
6. Vertical speed of crucible 300: 0.5 to 1.0 cm/s.

The nanoparticle material is InAs or HgTe. The nanoparticle-containing solution 302 is prepared according to a colloidal-solution-processing technique described, e.g., in "Efficient solution-processed infrared photovoltaic cells," *Applied Physics Letters*, 90, 183113. The nanoparticle mix in the solution consists of nanoparticles having radii of 2, 3, 4, 5, and 6 nm, with concentration in the range of $5\times10^{11}$-$2\times10^{13}$ cm$^{-3}$ (smaller particles have a higher concentration than larger particles). It is assumed that while the nanoparticles are in a solution, they are present in the form of quantum dots with attached organic ligands; these ligands either disappear during the evaporation cycle or remain with an FP during flight and deposition on the flexible substrate. Time-to-target for all FPs will range from 1.2 to 2.0 ms.

The nanostructured film 600 (FIGS. 2, 4, and 5) is formed when nanoparticles with the above-described parameters are deposited onto the flexible substrate 221 (FIG. 1) in the apparatus of the above-described application example and under conditions of the process described. This nanostructured film comprises a sequential nanoparticle layer structure with the thickness of each nanoparticle layer ranging from 8 to 15 nm. The size of the nanoparticles in an individual layer varies from 6 nm in the first deposited layer 610 to 2 nm in the uppermost layer 650 (FIG. 5).

Calculations made by a person skilled in the art show that power-conversion efficiency (PCE) will range from 20 to 25% or higher for a solar panel that is designed according to the model shown in FIG. 8 and produced according to the method of the invention under the above-described conditions. In reality, the PCE value will critically depend on many factors, some of which are not mentioned in the present specification. In general, such a parameter as the efficiency-to-cost ratio is estimated to be approximately 0.1$/W or less.

Although the invention has been shown and described with reference to specific embodiments, it is understood that these embodiments should not be construed as limiting the areas of application of the invention and that any changes and modifications are possible provided that these changes and modifications do not depart from the scope of the attached patent claims. For example, vertical motion of the crucible can start at the lowest position and proceed in the upward direction. The laser that produces an annular spot can be replaced by a regular IR-laser in combination with beam-deflecting and beam-guiding optics. The solution-evaporation area is not necessarily limited by the peripheral portion of the crucible, and, if necessary, a larger part of the solution surface can be irradiated by the laser beam. The structure of the flexible substrate is not limited by the example described and illustrated in the present specification and may include additional layers for more efficient electron collection and transport that follows photovoltaic conversion in PV-active nanostructured film. Although the nanostructure produced by the method of the invention is characterized by gradual increase in nanoparticle size in the direction from the substrate to the crucible, it is understood that the method allows arrangement of sizes and types of material in a variety of desired orders and thicknesses.

The invention claimed is:

1. A method of forming a flexible nanostructured material for a photovoltaic panel comprising:
   a. providing a flexible substrate;
   b. providing a liquid medium that contains nanoparticles selected from a group having different sizes and different types of material;
   c. providing a rotating body that has a surface;
   d. forming the flexible substrate into a substantially cylindrical body that has a longitudinal axis and surrounds the rotating body so that a space is provided between the rotating body and the flexible substrate;
   e. filling said space with a gaseous medium;
   f. placing the liquid medium onto said surface;
   g. providing an energy source capable of irradiating said surface and having energy sufficient for evaporating the liquid medium; and
   h. rotating the rotating body to impart centrifugal force to the liquid medium that contains nanoparticles and simultaneously evaporating the liquid medium by irradiating thereof with said energy source, thus releasing the nanoparticles from the liquid medium for their free flight through the gaseous medium toward the flexible substrate, whereby the particles of different sizes are deposited onto the flexible substrate in a predetermined sequence that corresponds to the magnitude of resistance experienced by the nanoparticles during their free flight so that said flexible nanostructured material is formed as a multilayer nanostructured film in which nanoparticles of larger size and greater density are deposited onto the flexible substrate and are located under the nanoparticles of smaller size and smaller density.

2. The method of claim 1, comprising a step of providing said surface of the rotating body with a recess that is flattened toward the edges of the rotating body.

3. The method of claim 2, wherein the step of providing the energy source comprises providing a power laser.

4. The method of claim 3, wherein the step of irradiating said surface comprises irradiating with an annular laser beam.

5. The method of claim 4, further comprising the step of moving the rotating body along the longitudinal axis of the cylindrical body.

6. The method of claim 5, further comprising the step of moving the power laser in the direction of the longitudinal axis of the cylindrical body and in synchronism with movement of the rotating body.

7. The method of claim 1, further comprising the step of moving the rotating body along the longitudinal axis of the cylindrical body.

8. The method of claim 7, wherein the step of providing the energy source comprises provision of a power laser.

9. The method of claim 8, wherein the step of irradiating said surface comprises irradiating with an annular laser beam.

10. The method of claim 9, further comprising the step of moving the power laser in the direction of the longitudinal axis of the cylindrical body and in synchronism with movement of the rotating body.

11. The method of claim 1, wherein the liquid medium comprises a colloidal solution, and the material of nanoparticles is selected from the group of materials belonging to groups IV, II-VI, and III-V of elements, metals, and metal oxides, said nanoparticles having sizes ranging from 2 nm to 10 nm.

12. The method of claim 11, wherein said material of nanoparticles is selected from the group consisting of Si, Ge, CdTe, CdSe, CdS, InP, TiOx, InAs, PbS, PbSe, HgTe, $CuInSe_2$, and $CuInGaSe_2$.

13. The method of claim 11, wherein the step of placing the colloidal solution onto said surface comprises supply of colloidal solution from a colloidal solution source.

14. The method of claim 13, comprising the step of providing said surface of the rotating body with a recess that is flattened toward the edges of the rotating body.

15. The method of claim 14, wherein the step of providing the energy source comprises provision of a power laser.

16. The method of claim 15, wherein the step of irradiating said surface comprises irradiating with an annular laser beam.

17. The method of claim 15, further comprising the step of moving the rotating body along the longitudinal axis of the cylindrical body.

18. The method of claim 17, wherein the step of irradiating said surface comprises irradiating with an annular laser beam.

19. The method of claim 18, further comprising the step of moving the power laser in the direction of the longitudinal axis of the cylindrical body and in synchronism with movement of the rotating body.

20. The method of claim 10, wherein the liquid medium comprises a colloidal solution, and the material of nanoparticles is selected from the group of materials belonging to groups IV, II-VI, and III-V of elements, metals, and metal oxides, said nanoparticles having sizes ranging from 2 nm to 10 nm.

21. The method of claim 20, wherein said material of nanoparticles is selected from the group consisting of Si, Ge, CdTe, CdSe, CdS, InP, TiOx, InAs, PbS, PbSe, HgTe, $CuInSe_2$, and $CuInGaSe_2$.

22. The method of claim 1, wherein the flexible substrate comprises at least the following layers arranged in sequence toward the rotating body: an insulating layer, a conductive film, and a carrier-blocking layer.

\* \* \* \* \*